US009012255B1

(12) United States Patent
Arunasalam et al.

(10) Patent No.: US 9,012,255 B1
(45) Date of Patent: Apr. 21, 2015

(54) MEMS PACKAGE

(71) Applicant: DunAn Microstaq, Inc., Austin, TX (US)

(72) Inventors: Parthiban Arunasalam, Austin, TX (US); Joe Albert Ojeda, Sr., Austin, TX (US)

(73) Assignee: DunAn Microstaq, Inc., Austin, TX (US)

( * ) Notice: Subject to any disclaimer, the term of this patent is extended or adjusted under 35 U.S.C. 154(b) by 0 days.

(21) Appl. No.: 14/060,716

(22) Filed: Oct. 23, 2013

Related U.S. Application Data

(62) Division of application No. 13/244,479, filed on Sep. 25, 2011, now abandoned.

(60) Provisional application No. 61/407,103, filed on Oct. 27, 2010.

(51) Int. Cl.
 *H01L 21/00* (2006.01)
 *B81C 1/00* (2006.01)
 *H01L 29/00* (2006.01)
 *B01L 3/00* (2006.01)

(52) U.S. Cl.
 CPC ......... *B81C 1/00309* (2013.01); *B81C 1/00301* (2013.01); *H01L 29/00* (2013.01); *B01L 3/502715* (2013.01); *B01L 2200/027* (2013.01)

(58) Field of Classification Search
 CPC .......... B01L 2200/027; B01L 2200/10; B01L 2300/0819; B01L 2400/0638; B01L 9/527; B81B 2201/058; G01N 27/44791; G01N 30/6095
 See application file for complete search history.

(56) References Cited

U.S. PATENT DOCUMENTS

| 6,653,124 | B1 * | 11/2003 | Freeman | 435/297.1 |
|---|---|---|---|---|
| 8,087,310 | B2 * | 1/2012 | Meng et al. | 73/864.86 |
| 8,169,006 | B2 * | 5/2012 | Kim et al. | 257/253 |
| 2002/0022261 | A1 * | 2/2002 | Anderson et al. | 435/287.2 |
| 2002/0071788 | A1 * | 6/2002 | Fujii et al. | 422/102 |
| 2002/0100714 | A1 * | 8/2002 | Staats | 210/85 |
| 2002/0168671 | A1 * | 11/2002 | Burns et al. | 435/6 |
| 2002/0168780 | A1 * | 11/2002 | Liu et al. | 436/180 |
| 2003/0096081 | A1 * | 5/2003 | Lavallee et al. | 428/138 |
| 2004/0005628 | A1 * | 1/2004 | Foster | 435/7.1 |
| 2004/0053422 | A1 * | 3/2004 | Chan et al. | 436/180 |
| 2004/0163717 | A1 * | 8/2004 | Gilleo | 137/565.29 |
| 2004/0219072 | A1 * | 11/2004 | Yamakawa et al. | 422/100 |
| 2005/0230767 | A1 * | 10/2005 | Park et al. | 257/414 |
| 2006/0166357 | A1 * | 7/2006 | Takayama et al. | 435/289.1 |
| 2008/0277356 | A1 * | 11/2008 | Mouradian et al. | 210/779 |
| 2009/0120865 | A1 * | 5/2009 | Chung et al. | 210/232 |
| 2010/0133510 | A1 * | 6/2010 | Kim et al. | 257/24 |
| 2011/0112606 | A1 * | 5/2011 | Gatherer et al. | 607/50 |

\* cited by examiner

*Primary Examiner* — Steven J Fulk
(74) *Attorney, Agent, or Firm* — MacMillan, Sobanski & Todd, LLC

(57) ABSTRACT

A method of manufacturing a MEMS package includes initially providing a substrate formed of a first material and defining a bore therein. The bore is substantially completely lined with a second material that is different from the first material. A micromachined component having a fluid passageway formed therein is affixed to the substrate such that the bore and the fluid passageway are in fluid communication.

6 Claims, 10 Drawing Sheets

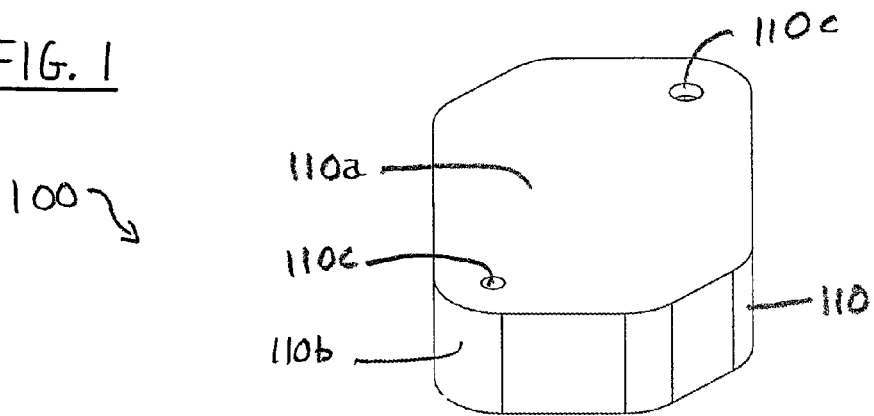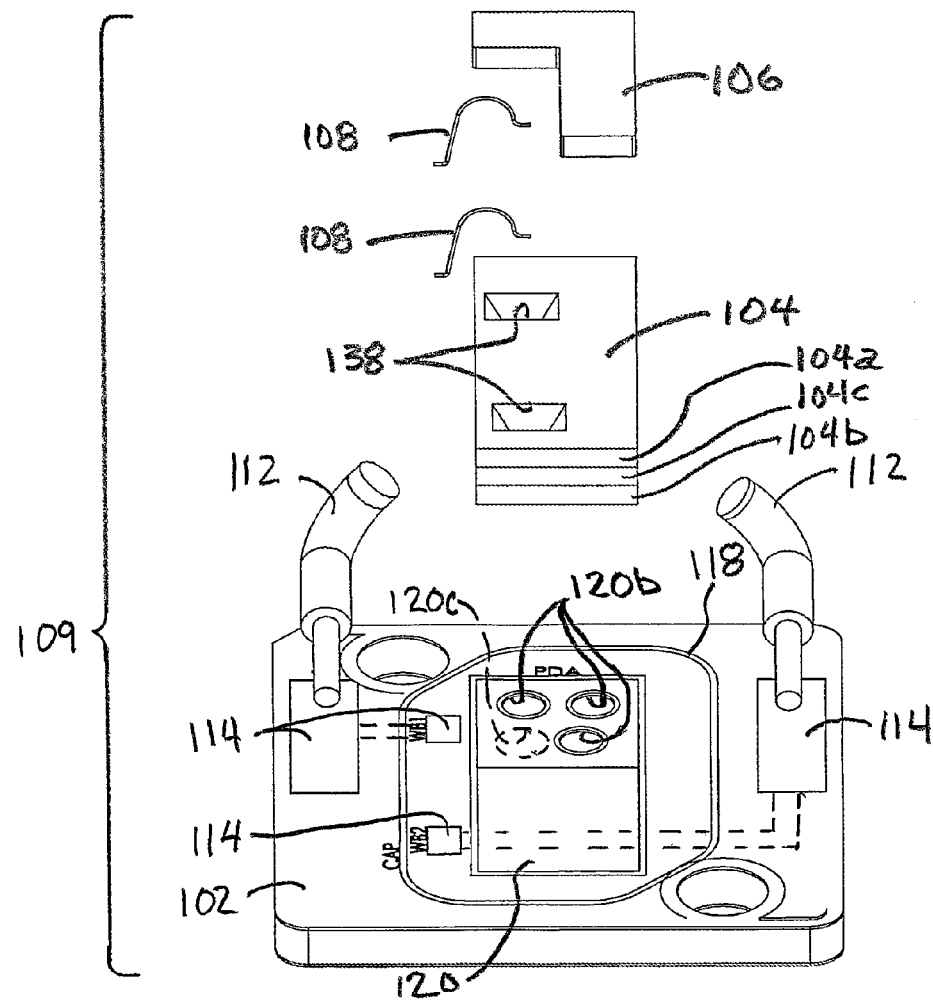
FIG. 1

901 — providing a multi-layer substrate formed of:
    an electronic interface layer, the electronic interface layer comprising an electrical conductor and a bore defined through the electronic interface layer;
    a fluidic channel layer, the fluidic channel layer defining a space therein; and
    a fluid introduction layer, the fluid introduction layer defining a fluid port, the space defined in the fluidic channel layer being in fluid communication with the fluid port of the fluid introduction layer 902 — affixing an electrically active micromachined component having a fluid passageway formed therein to the multi-layer substrate, such that:
    the electrical conductor of the electronic interface layer is electrically connected to the electrically active micromachined component; and
    the bore of the electronic interface layer is in fluid communication with the fluid passageway of the electrically active micromachined component and in fluid communication with the space defined in the fluidic channel layer.

FIG. 9

MEMS PACKAGE

CROSS-REFERENCE TO RELATED APPLICATIONS

This application is a divisional patent application of U.S. patent application Ser. No. 13/244,479, filed Sep. 25, 2011, which claims the benefit of U.S. Provisional Application No. 61/407,103, filed Oct. 27, 2010. The disclosure of both of these applications are incorporated herein by reference.

BACKGROUND OF THE INVENTION

This invention relates in general to the structure of a MEMS package, in particular a MEMS fluidic package platform that provides for interconnection of one or more fluid passageways of a MEMS device with one or more fluid passageways of another device. The MEMS package may also be a MEMS electrofluidic package platform that provides for interconnection of electrical circuitry of a MEMS package with other electrical circuitry. The invention also relates to methods of constructing such MEMS fluidic packages.

MEMS (micro electro mechanical systems) are a class of systems that are physically small, having some features or clearances with sizes in the micrometer range or smaller (i.e., smaller than about 10 microns). These systems have both electrical and mechanical components. The term "micro machining" is commonly understood to mean the production of three-dimensional structures and moving parts of MEMS devices. MEMS originally used modified integrated circuit (e.g., computer chip) fabrication techniques (such as chemical etching) and materials (such as silicon semiconductor material) to micro machine these very small mechanical devices. Today there are many more micro machining techniques and materials available. The term "MEMS device" as may be used in this application means a device that includes a micro machined component having some features or clearances with sizes in the micrometer range, or smaller (i.e., smaller than about 10 microns). It should be noted that if components other than the micro machined component are included in the MEMS device, these other components may be micro machined components or standard sized (i.e., larger) components. Similarly, the term "microvalve" as may be used in this application means a valve having features or clearances with sizes in the micrometer range, or smaller (i.e., smaller than about 10 microns) and thus by definition is at least partially formed by micro machining. The term "microvalve device" as may be used herein means a device that includes a microvalve, and that may include other components. It should be noted that if components other than a microvalve are included in the microvalve device, these other components may be micro machined components or standard sized (i.e., larger) components. The term "MEMS package" as used herein should be understood to mean a device, which includes a micromachined component and may include other components that may be micromachined components or standard sized components. A "MEMS fluidic package" should be understood to be a MEMS package including a fluid passageway. A "MEMS electrofluidic package" as used herein should be understood to be a MEMS package including a fluid passageway and an electrically active component that may be a micromachined component. A "MEMS package platform" as used herein should be understood to be an interface component or assembly of components upon which a MEMS device may be mounted and by means of which the MEMS device can be interfaced with an external system.

Many MEMS devices may be made of multiple layers (or substrates) of material, which may be micromachined to form components of the MEMS device prior to assembly of the multiple layers into a completed MEMS device. For example, such a MEMS device may be manufactured using suitable MEMS fabrication techniques, such as the fabrication techniques disclosed in U.S. Pat. No. 6,761,420, the disclosures of which are incorporated herein by reference; U.S. Pat. No. 7,367,359, the disclosures of which are incorporated herein by reference; Klassen, E. H. et al. (1995). "Silicon Fusion Bonding and Deep Reactive Ion Etching: A New Technology for Microstructures," Proc. Transducers 95 Stockholm Sweden, pp. 556-559, the disclosures of which are incorporated herein by reference; and Petersen, K. E. et al. (June 1991). "Surface Micromachined Structures Fabricated with Silicon Fusion Bonding, "Proceedings, Transducers' 91, pp. 397-399, the disclosures of which are incorporated herein by reference.

Various aspects of this invention will become apparent to those skilled in the art from the following detailed description of the preferred embodiment, when read in light of the accompanying drawings.

BRIEF DESCRIPTION OF DRAWINGS

FIG. 1 is an exploded perspective view of a MEMS package.

FIG. 9 is a flow chart illustrating another method of manufacturing a MEMS package.

DETAILED DESCRIPTION

Figure 2:
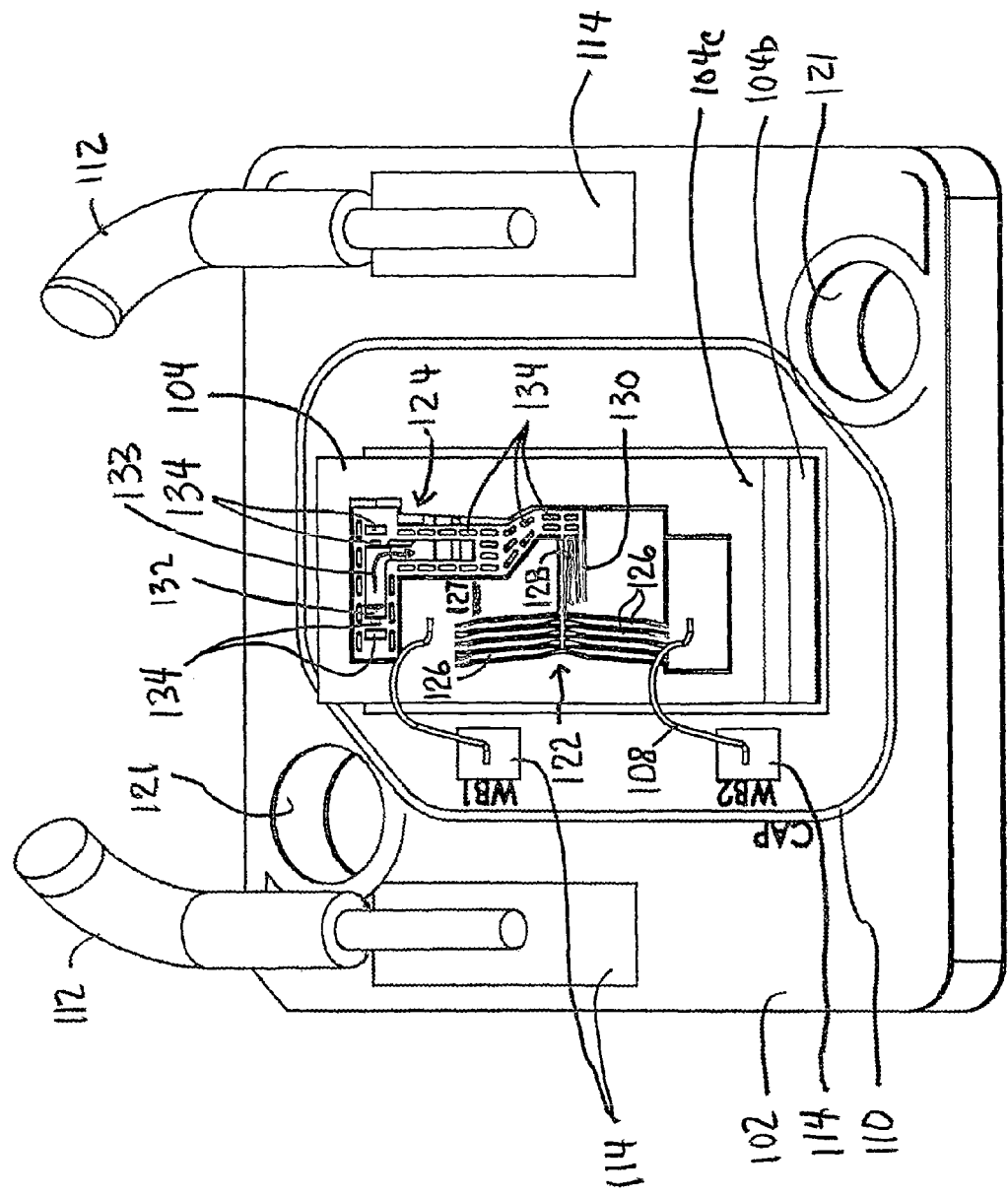
FIG. 2 is an enlarged view of a MEMS package platform, together with a partial view of a MEMS device, contained within the MEMS package shown in FIG. 1.

Preliminarily, it should be noted that certain terms used herein, such as "upper", "lower", "middle", "upward", "downward", "top", "bottom", "front", "back", and "side", are used to facilitate the description of the preferred embodiment of the invention. Unless otherwise specified or made apparent by the context of the discussion, such terms should be interpreted as intended merely to facilitate the description of the features under discussion. Such terms are not intended as a limitation on the orientation in which the components of the invention may be used.

Referring now to the drawings, FIG. 1 is an exploded perspective view of a MEMS package 100. The MEMS package 100 may include a die carrier substrate 102, a micromachined component such as a MEMS device 104 in the form of a MEMS device, a burst cap 106, a first set of connecting wires 108, and a die cap 110. The MEMS device 104, the first set of connecting wires 108, and the die carrier substrate 102 form as MEMS package platform 109, shown assembled in an enlarged partial perspective view in FIG. 2.

The die cap 110 is conventional in manufacture, and as such may be made of metal, plastic, ceramic, glass, etc. The die cap 110 may be a generally cupped shape component, with a generally planar central portion 110a, and a depending peripheral skirt 110b. The central portion 110a may be provided with one or more relief holes 110c extending therethrough. The relief holes 110c form a passageway for polymer, dielectric, or phase change materials and the like (not shown) which may be suitably deposited within the die cap to surround and protect the components therein (e.g., the MEMS device 104 and first set of connecting wires 108) when the die cap 110 is mounted on the die carrier substrate 102.

The first set of connecting wires 108 may be formed of any suitable material. If a wire bonding process is used to attach (as discussed below) the connecting wires 108, then the connecting wires 108 may be referred to as bondwires. Bondwires usually consist of one of the following materials: aluminum, copper, or gold, or alloys thereof, but any suitable material may be used to manufacture the connecting wires 108, regardless of whether a wire bonding process is used in electrically connecting the connecting wires 108 to various components of the MEMS package 100.

The MEMS package 100 may include the burst cap 106, which is generally a reinforcing structural member to help prevent the MEMS device 104 from bursting due to internal fluid pressures in those installations where expected or possible fluid pressure could exceed failure limits of the material forming the MEMS device 104. Of course, the burst cap 106 may be omitted if the additional reinforcement provided by a burst cap is not required. The burst cap 106 may be formed of any suitable material, such as single crystal silicon, other forms of silicon, ceramics, metals, glass, and the like. The burst cap 106 is operatively held in position by any suitable method, such as bonding, adhering, soldering, or mechanical restraint, etc., against the upper surface of the MEMS device 104, to reinforce regions which are in need of reinforcement, such as portions of the MEMS device 104 define relatively wide (albeit likely sized in small fractions of a centimeter in width) cavities exposed to fluid pressure and not otherwise supported against bursting by another component of the MEMS package 100, such as the substrate 102 beneath the MEMS device 104.

The die carrier substrate 102 may be formed of any suitable material, such as a metal such as aluminum; a ceramic; a polymer, glass, a semiconductor material, or a composite material such as a fiberglass reinforced plastic composite material; etc. One material believed to be especially suitable to form at least a part of the die carrier substrate 102 is FR-4-PCB. FR-4 is a grade designation for glass reinforced epoxy laminate (in the form of sheets or other shapes) which can be utilized to form printed circuit boards (PCB). FR-4-PCB is formed of a non-electrically conductive, flame resistant epoxy resin reinforced by a woven fiberglass cloth. Substrates made of conductive materials such as metals may be coated with an insulating material (not shown) in appropriate locations by known methods while leaving other locations uncoated to allow (for example) interconnection of the connecting wires 108 with a set of external connecting wires 112. The interconnection between the first set of connecting wires 108 and the set of external connecting wires 112 may be made in any suitable fashion. One such suitable fashion may be as shown in FIG. 1, where the interconnection is made via a suitable conductive material (such as copper, copper alloy, nickel, gold, etc.) fixed (by electroplating, sputtering, screen printing, laminating, or other suitable technique) to a surface of the die carrier substrate 102. In a preferred embodiment the interconnection is made using conductive pathways, tracks or signal traces etched from copper sheets laminated onto a non-conductive die carrier substrate 102 made of FR-4-PCB to form wire bond or solder pads 114. As may be required, one end of each wire of the first set of connecting wires 108 is fixed to a respective pad 114 by a suitable method, such as soldering or wire bonding. Also as may be required, a corresponding wire of the set of external connecting wires 112 can be fixed to the associated pad 114 by any suitable method, such as by utilizing an SMT (surface mount technology) wire clamp (not shown) mounted on the pad 114, soldering the associated wire 112 directly to the pad 114, affixing the associated wire 112 to the pad 114 with conductive adhesive, etc.

Other features of the die carrier substrate 102 may include a die cap bond line 118, and a MEMS chip attachment interface 120. The die cap bond line 118 may be a prepared surface to which the peripheral skirt 110b of the die cap 110 may be bonded to fix the die cap 110 to the die carrier substrate 102. The MEMS chip attachment interface 120 may include a prepared surface 120a (such as a solder pad [such as a laminated copper sheet, brazed metallic pad, sputtered metallic surface, etc.], a roughened or recessed surface to receive adhesives (not shown), etc.) to which the MEMS device 104 may be fixed to the prepared surface 120a. The MEMS device 104 may be soldered, glued, clamped, or otherwise fixed to the prepared surface 120a of the die carrier substrate 102 by any suitable method, including the methods disclosed in U.S. Pat. No. 6,581,640 to Barron, the disclosures of which are incorporated herein by reference, and the methods disclosed in U.S. Pat. No. 6,505,811 to Barron, et al., the disclosures of which are incorporated herein by reference. The MEMS chip attachment interface 120 may also include one or more fluid carrying bores or fluid conduits 120b formed by suitable means (such as punching, drilling by mechanical bit or laser, etching, etc.) extending therethrough. Additionally, a pair of apertures 121 are shown provided through the die carrier substrate 102, by means of which mechanical fasteners (not shown), such as bolts, screws, rivets, etc., may be used to mechanically attach the MEMS package platform 109 (and thus the MEMS package 100) to an external structure (not shown).

FIG. 2 is an enlarged assembled view of the MEMS package platform 109 contained within the MEMS package 100 shown in FIG. 1. The micromachined component of the MEMS package 100 may be any micromachined fluidic component, in the form of a fluidic die or other micromachined component contained in the MEMS device 104 that facilitates or controls a fluidic signal or pulse, whether in the form of a pressure differential or flow, or that facilitates or controls the movement of fluid from one port to another. The micromachined component or components contained in the MEMS device 104 may include, for example, such micromachined fluidic devices as a microvalve, a micromachined pump, a micromachined manifold or fluid conduit transporting fluid to one or more sensors, such as pressure, temperature, flow sensors, etc., or a combination of fluidic components in a one or more chips (fluidic dies). In FIG. 2, for the purpose of example only, the MEMS device 104 is a multi-layer microvalve, such as that illustrated in International Patent Application PCT/US2009/050063, published as WO 2010/019329 A2, the disclosures of which are incorporated by reference herein. U.S. Pat. Nos. 6,523,560; 6,540,203; and 6,845,962, the disclosures of which are incorporated herein by reference, also describe microvalves made of multiple layers of material. The multiple layers are micromachined and bonded together to form a microvalve body and the various microvalve components contained therein, including an intermediate mechanical layer containing the movable parts of the microvalve. The movable parts are formed by removing material from an intermediate mechanical layer (by known micromachined device fabrication techniques, such as, but not limited to, Deep Reactive Ion Etching) to create a movable valve element that remains attached to the rest of the part by a spring-like member. Typically, the material is removed by creating a pattern of slots through the material of uniform width to achieve the desired shape.

The MEMS device 104 may be formed of multiple layers of material bonded together. As seen in FIG. 1, these layers body may include a top layer 104a, a bottom layer 104b, and an intermediate layer 104c adjacently located between the top layer 104a and the bottom layer 104b. Note that the terms "top" and "bottom" as used herein are not meant to be interpreted as limitations on the orientation of components as installed in actual installations or during use. In FIG. 2, the multi-layer MEMS device 104 is shown with the top layer 104a thereof removed so that the intermediate layer 104c, containing moving valve elements, may be seen. The MEMS device 104 includes an actuator, indicated generally at 122, and a movable valve element, indicated generally at 124.

The actuator 122 may be of any suitable type of actuator. In the illustrated embodiment, the actuator 122 is a thermal actuator formed of a plurality of ribs 126 joined in a herringbone pattern to a central spine 128. When the ribs 126 are heated, such as by passing an electrical current through the ribs 126, the ribs 126 elongate. Each rib 126 is fixed to the central spine 128 at one end, and to a fixed portion 127 of the MEMS device 104. When the opposed inclined sets of ribs 126 elongate, the ribs 126 urge the central spine 128 of the actuator 122 in the direction toward the valve element 124.

The valve element 124 is operatively coupled to the central spine 128 at a first location along the length of the valve element 124. The valve element 124 also includes a flexible hinge 130 at a second location, spaced apart from the first location. The flexible hinge 130 is operatively coupled at one end to the fixed portion 127. During actuation, movement of the central spine 128 causes the valve element 124 to bend the hinge 130, thus causing the valve element 124 to move along a path of arcuate motion. The actuator 122 moves the valve element 124 through a normal range of travel along the path of arcuate motion so as to selectively block and unblock one or more fluid ports 132 in the bottom layer 104b of the MEMS device 104, thus controlling fluid flow through a passageway 133 in the illustrated MEMS device 104. The passageway 133 provides fluid communication between the ports 132 as controlled by the valve element 124. When the actuator 122 is deenergized, the ribs 126 contract and the bending forces in the central spine 128 and the hinge 130 return the valve element 124 back toward an unactuated position.

It may be appreciated that the MEMS device 104 is a "MEMS fluidic package" (since it is a MEMS package that includes the fluid passageway 133). It may also be appreciated that the MEMS device 104 is also a "MEMS electrofluidic package" (since it is a MEMS package including both the fluid passageway 133 and an electrically active component in the form of the electrically actuated micromachined valve including the actuator 122 and the valve element 124.

The movable parts (including the actuator 122, the valve element 124, the ribs 126, the central spine 128, the hinge 130, and any other movable parts of the MEMS device 104) may be formed by removing material from the intermediate layer 104c. The material is removed from around the moving parts to separate the moving parts from the fixed portion 127 of the body. More specifically, the material may be removed by creating a pattern of slots through the material of the intermediate layer to achieve the desired shape. Additionally, shallow recesses (not shown) may be formed in fixed portions of the body adjacent to the moveable parts of the MEMS device 104, so as to limit friction between the movable parts of the MEMS device 104 and the adjacent fixed parts of the body of the MEMS device 104.

As can be seen in the figures, various openings 134 (vents, ducts, or apertures) may be formed perpendicularly (that is, perpendicular to a plane defined by the motion within which the valve element 124 is constrained to move during normal range of travel) through various portions of the valve element 124. One effect of such openings 134 is to help prevent or diminish pressure imbalances between the perpendicularly opposed surfaces of the valve element 124, so that the valve element 124 is not urged into "out of plane" movement so as to drag against the layers of material adjacent to the intermediate layer from which the movable parts are fabricated.

As indicated above, the MEMS device 104 of the illustrated embodiment includes the valve element 124 actuated by the actuator 122. The actuator 122 is operated by heating the ribs 126 by the application of electrical power. The selective heating of the ribs 126 of the MEMS device 104 causes movement due to thermal expansion of the material composing the ribs 126 of the MEMS device 104. The connecting wires 108 may extend through openings 138 (seen in FIG. 1) in the top layer 104a of the MEMS device 104 to be electrically connected to the intermediate layer 104c on opposite sides of the actuator 122, so that such electrical power in the form of an electrical current can be passed from one of the connecting wires 108 through the ribs 126 to the other of the connecting wires 108, electrically heating the ribs 126 in response to the amount of electrical current passed therethrough.

The MEMS device 104 may be fixed (by any suitable means, as discussed above) to the die carrier substrate 102 such that the fluid conduit 120b of the MEMS chip attachment interface 120 and one of the ports 132 (and thereby, the fluid passageway 133) of the MEMS device 104 are in fluid communication via a substantially leak-tight connection therebetween. One method of forming such leak tight connection therebetween is by forming a solder connection between respective adjacent faces of the MEMS device 104 and the MEMS chip attachment interface 120, the solder connection extending about associated openings of the fluid conduit 120b (opening in the prepared surface 120 of the MEMS chip attachment interface 120) and of the fluid passageway 133 (opening as one of the ports 132 in a respective adjacent face of the MEMS device 104). Such a solder connection thus will define a void forming a fluid passageway between the fluid conduit 120b and the fluid passageway 133 similar in function to that provided by the void 320B described in U.S. Pat. No. 6,505,811 to Barron, et al., incorporated by reference, where the void 320B is defined in a solder joint 320 connecting a fluid passageway in a microvalve device 312 to a passage 316B in a fluid distributing substrate 314.

In particular, one suitable arrangement is where the die carrier substrate 102 is formed of at least a first material (such as epoxy or fiberglass, or composite such as FR-4-PCB), with each of the fluid conduits 120*b* being defined in the die carrier substrate 102. In a preferred embodiment, the fluid conduits 120*b* are substantially completely through-lined with a lining that is formed of a second material that is different from the first material of which the die carrier substrate 102 is composed. The second material is preferably one that can act as a fluid barrier to confine any fluid passing through the fluid conduits 120*b* within the fluid conduits 120*b* as the fluid passes through the die carrier substrate 102. For example, in one preferred embodiment the fluid conduits 120*b* are through-lined (substantially completely lined) with a suitable metallic material (such as solder, copper, nickel, gold, etc.). Lined holes may be formed in any suitable fashion. One method could be drilling the fluid conduits 120*b*, performing electroless deposition on the interior of the fluid conduit 120*b* after the fluid conduits 120*b* are drilled, and then electroplating copper ("the second material") onto the interior of the fluid conduit 120*b* to build up a desired thickness of the second material. Preferably, the second material lining the fluid conduits 120*b* connects with the prepared surface 120*a* to form a leak-tight connection therebetween. The second material lining the fluid conduits 120*b* may also connect with an annular sealing surface 120*c* (only one of which is seen in phantom in FIG. 1) that may be provided on the opposite surface of the die carrier substrate 102 from that on which the prepared surface 120*a* is formed (the opposite surface is not seen in FIG. 1). The annular sealing surface 120*c* may be provided to facilitate connection to an external fluid circuit (not shown), by any conventional method, including the use of o-rings or other elastomeric seals in machined pockets as part of a fluid tight mechanical connection.

Thus the MEMS device 104 is a micromachined component having the fluid passageway 133 formed therein, the micromachined component being fixed to the die carrier substrate 102 such that at least one of the fluid conduits 120*b* and the fluid passageway 133 are in fluid communication via a substantially leak-tight connection therebetween (via a respective one of the ports 132 of the MEMS device 104).

Figure 3:
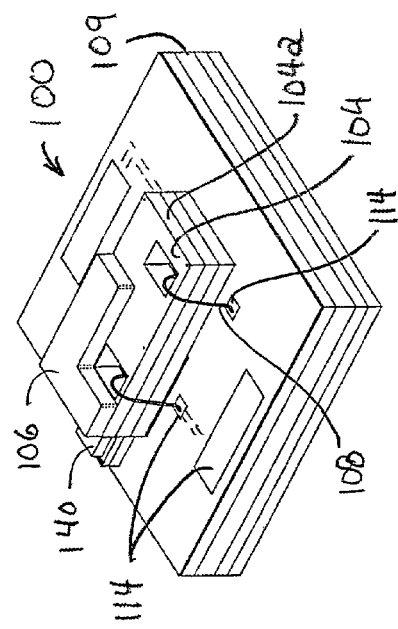
FIG. 3 is a perspective view of the MEMS package platform and MEMS device of FIGS. 1 and 2.
Figure 4:
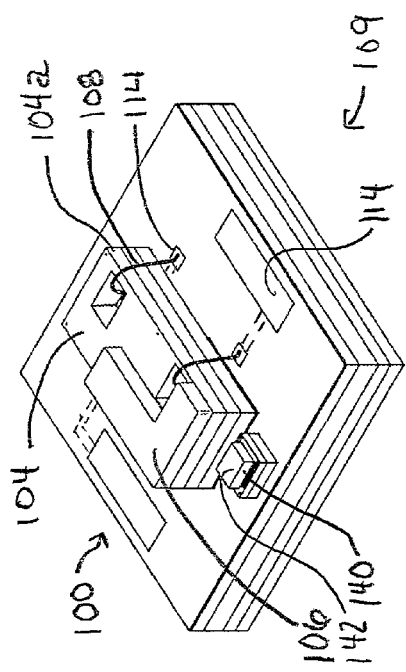
FIG. 4 is a view of the MEMS package platform and MEMS device shown from a different perspective than that of FIG. 3.

FIGS. 3 and 4 are perspective views of an alternate embodiment of the MEMS package platform 109 of the MEMS package 100 of FIGS. 1 and 2. In the views of FIGS. 3 and 4, the top layer 104*a* of the MEMS device 104, and the burst cap 106 are shown in position on the MEMS device 104. So that extent of the pads 114, to which respective ones of the first set of connecting wires 108 are connected may be seen more clearly, the die cap bond line 118 is not shown. In the embodiment of FIGS. 3 and 4, the apertures 121 for mechanically fastening the MEMS package 100 to an external structure may be eliminated, for reasons that will be explained below.

Also shown fixed to the die carrier substrate 102 is a sensor 140, which may be any suitable type of sensor. For example, the sensor 140 might be a pressure sensor in fluid communication with one of the through-lined fluid conduits 120*b* via a fluid passageway (not seen in FIG. 3 or 4). The sensor 140 is provided with a wire bond pad 142 by means of which a signal wire (not shown) may be attached to receive a sensor signal output.

Figure 5A:
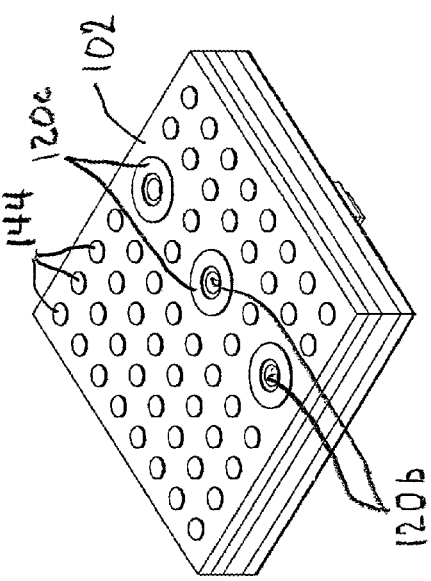
FIG. 5A is a bottom perspective view of a die carrier substrate of the MEMS package platform of FIGS. 1-4 that is metalized for solder attachment.

FIG. 5A is a bottom perspective view of the alternate embodiment of the die carrier substrate 102 of the MEMS package platform 109 of FIGS. 3-4. The illustrated bottom surface (opposite to the top surface to which the MEMS device 104 may be attached) of the die carrier substrate 102 may be metalized to permit, for example, solder-type based surface mount attachment (such as ball grid array (BGA), land grid array (LGA), etc.) to the structure (not shown) of an external fluid circuit. The annular sealing surfaces 120*c* about the opening of each of the fluid conduits 120*b* is illustrated as respective annular metalized rings to which, for example, a soldered, solder-type, or brazed connection (not shown) will define a fluid passageway providing fluid communication with the external fluid circuit. A plurality of metalized dots 144 are formed on the surface of the die carrier substrate 102 by means of which the die carrier substrate 102 may be mechanically attached to an external structure (not shown) by, for example, a soldered, solder-type, or brazed connection (not shown). Thus, this arrangement for mechanical attachment makes mechanical fasteners redundant, and the apertures 121 (provided in the embodiment shown in FIGS. 1 and 2) through which such mechanical fasteners could be inserted are eliminated from the embodiment shown in FIGS. 3, 4, and 5A.

Figure 5B:
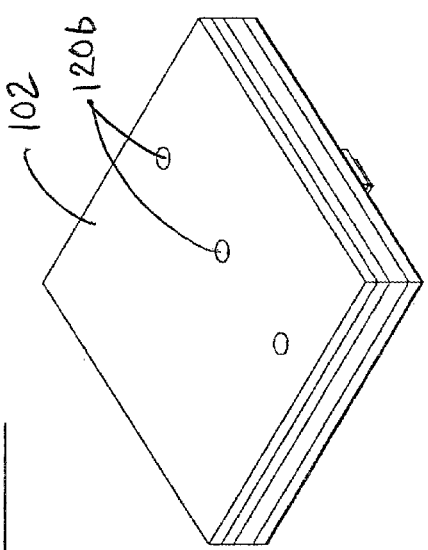
FIG. 5B is a view similar to FIG. 5A, except showing an alternate embodiment of a die carrier substrate that has no metallization.

FIG. 5B is a view similar to FIG. 5A, except showing an alternate embodiment of the die carrier substrate 102 that has no metallization on the bottom surface thereof. Instead, it is anticipated that fluid communication between the fluid conduits 120*b* and an external fluid circuit (not shown) might be made through o-rings (not shown), an opening in a gasket (not shown), an epoxy or other adhesive layer (not shown), etc. An epoxy or other adhesive layer could not only provide for fluid communication through voids formed within such adhesive layer, but also could provide for mechanical attachment of the die carrier substrate 102 to an external structure (not shown). If such adhesive layers were not sufficiently strong for required mechanical attachment, or if a gasket, o-ring, or other arrangement that provides no substantial mechanical attachment were utilized, any suitable means for mechanical attachment of the die carrier substrate 102 to an external structure might be used. For example, although not shown, apertures similar to the apertures 121 through which mechanical fasteners could be inserted might be provided; or, an external clamping arrangement (not shown) might be provided for holding the die carrier substrate 102 in a required position relative to an external structure (not shown).

Figure 6:
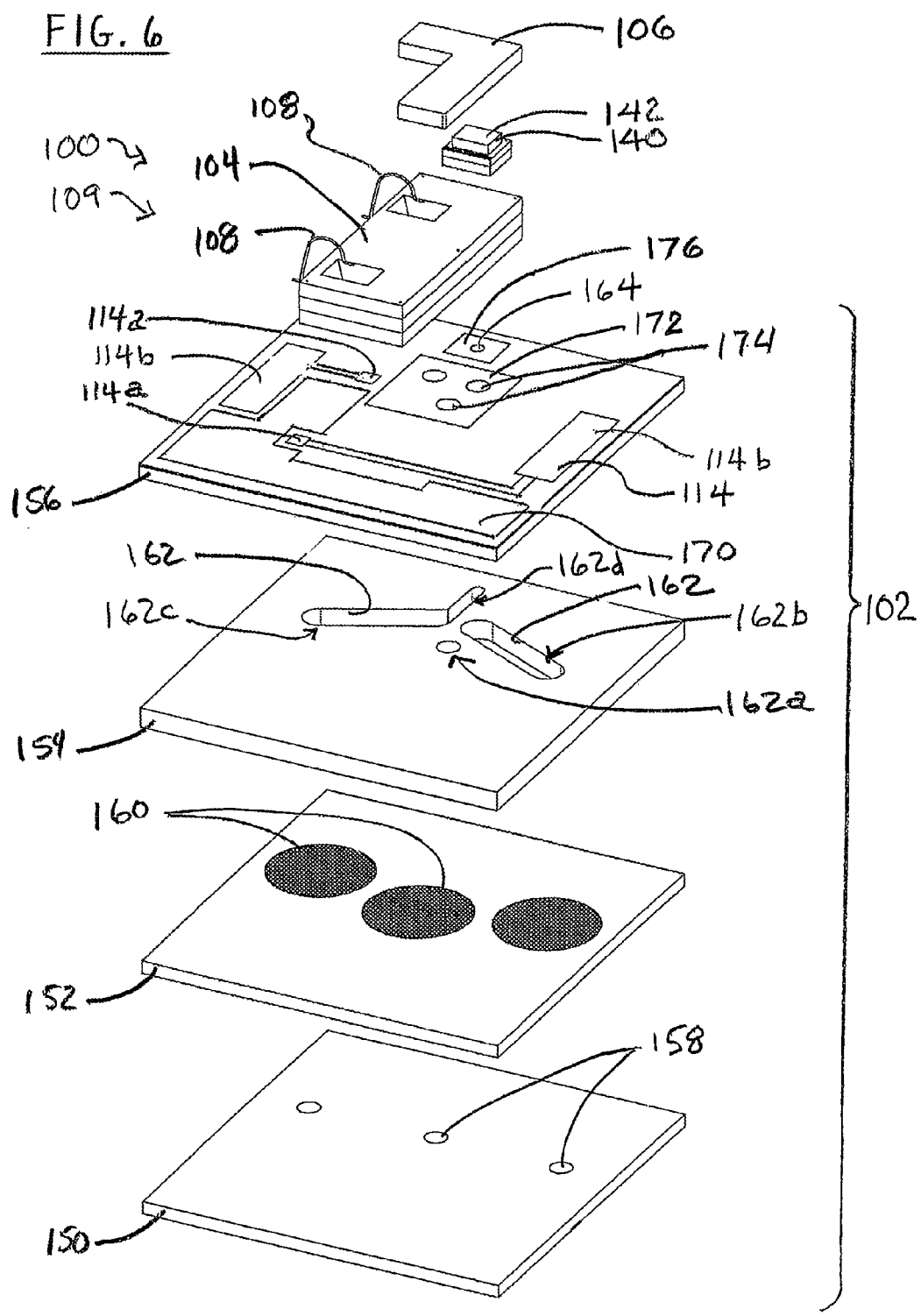
FIG. 6 is an exploded perspective view of an alternate embodiment of a MEMS package having filters integrally formed in a filtration layer.

The embodiments shown in FIGS. 5A and 5B show openings into the fluid conduits 120*b* arranged in a straight line, while the openings into the fluid conduits 120*b* shown in FIG. 1 are arranged to define a triangle. This is explained by reference to FIG. 6, which is an exploded perspective view of a MEMS package platform 109, which is representative of the MEMS package platform 109 of either of the embodiments shown in FIG. 5A or 5B. As shown in FIG. 6, the die carrier substrate 102 may be formed of multiple layers, which may include a fluid introduction layer 150, a filtration layer 152, a fluidic channel layer 154, and an electronic interface layers. It is contemplated, and should be understood, that each of the layers 150, 152, 154, and 156 which are illustrated as a single layer may be further composed of multiple further layers (not shown) to facilitate construction or functionality of such layers 150, 152, 154, and 156, and further that additional layers (not shown) to provide further functionality such as more complex fluid routing or processing, or for embedding additional electronic circuitry for sensing, signal processing, calculation, control, etc., may be provided.

The fluid introduction layer 150 may be formed of any suitable material, such as a ceramic, polymer, metal, glass, semiconductor or crystalline material, or a composite material. The fluid introduction layer 150 may have one or more fluid ports 158 formed therethrough. The fluid ports 158 form the openings of the fluid conduits 120*b* into the bottom surface of the die carrier substrate 102, such as is shown in the embodiments of FIGS. 5A and 5B, and may be arranged in a straight line as shown therein, or any other suitable arrangement. The fluidic ports 158 thus form the portion of the fluid conduits 120*b* extending through the fluid introduction layer 150 of the die carrier substrate 102. The fluid ports 158 may be through-lined with a suitable metallic material (such as solder, copper, nickel, gold, etc.), which may be especially desirable if the fluid introduction layer 150 is formed of a porous material or a composite material such as FR-4-PCB, for example. However, if the fluid introduction layer 150 is formed of a non-porous material such as a polymer or a solid metal, such through-lining would not be required to form a fluid-tight passageway through the fluid introduction layer 150. The fluid ports 158 may be formed by any suitable means (which may vary depending upon the material from which the fluid introduction layer 150 is formed), such as punching, drilling, etching, laser cutting, molding during formation of the rest of the fluid introduction layer 150, etc.

The filtration layer 152 may be made of any suitable material, such as a ceramic, polymer, metal, glass, semiconductor or crystalline material, or a composite material. The filtration layer 152 may be provided with one or more integral filter screens 160. Although referred to as a filter screen, the filter screens 160 need not be a woven mesh screen. Rather, the filter screens 160 may merely be a plurality of parallel fluid flow paths through a physical barrier, each such parallel fluid flow path being of reduced size compared to an adjacent portion of the fluid conduit 120*b* through the die carrier substrate, such that particles can be filtered out of a fluid flowing through the filter screens 160. Thus, one of the filter screens 160 may, for example, consist of a plurality of apertures through the filtration layer forming parallel reduced-diameter flow paths therethrough in fluid communication with the associated fluid conduit 120*b*. The filter screens 160 may be formed in any fashion suitable for the material, such as by punched, drilling, laser cutting, molding, etc., during formation of the rest of the filtration layer 152, etc.

Each filter screen 160 may be aligned with a respective one of the fluid ports 158. The circumferential area of the filtration layer 152 about each filter screen may be sealed against a corresponding circumferential area of the fluid introduction layer 150 about the associated fluid port 158 so that fluid flowing through the associated fluid port 158 of the fluid introduction layer 150 will flow through the associated filter screen 160. The flow path through the filter screens 160 of the filtration layer 152 thus forms the portion of the fluid conduits 120*b* extending through the filtration layer 152 of the die carrier substrate 102. It is contemplated that the flow path through the filtration layer 152 may be through-lined, including each aperture forming a flow path though the filter screens 160. The fluid port 158 may be smaller in cross-sectional area than the associated filter screen 160; in such case, suitable provisions may be made to distribute the fluid flow across the entire area of the filter screen 160. Such suitable provisions may include, for example, recessing the filter screen 160 below the surrounding surface of the filtration layer 152 (this method not shown), providing a chamfer or countersink (not shown) the size of the associated filter screen 160 about the adjacent opening into the fluid port 158, providing an intervening layer (not shown) with a bore therethrough of a diameter at least as large as, and aligned with, the filter screen 150, etc.

It will be appreciated that the filtration layer 152 thus described may comprise a body of monolithic material forming a filtration layer in the multi-layer die carrier substrate 102, the body of monolithic material having a plurality of apertures formed therethrough for filtering a fluid flow through the filtration layer 152.

The fluidic channel layer 154 may be made of any suitable material, such as a ceramic, polymer, metal, glass, semiconductor or crystalline material, or a composite material. The fluidic channel layer 154 may have one or more fluidic channels 162 formed therethrough. The fluidic channels 162 form the portions of the fluid conduits 120*b* extending through the fluidic channel layer 154 of the die carrier substrate 102. The fluidic channels 162 may be through-lined with a suitable metallic material (such as solder, copper, nickel, gold, etc.), which may be especially desirable if the fluidic channel layer 154 is formed of a porous material or a composite material such as FR-4-PCB, for example. However, if the fluidic channel layer 154 is formed of a non-porous material such as a polymer or a solid metal, such through-lining would not be required to form a fluid-tight passageway through the fluidic channel layer 154. The fluidic channels 162 may be formed by any suitable means (which may vary depending upon the material from which the fluidic channel layer 154 is formed), such as punching, drilling, milling, etching, laser cutting, molding during formation of the rest of the fluid channel layer 153, etc.

Each fluidic channel 162 may be smaller in cross-sectional area than the associated filter screen 160; in such case, suitable provisions may be made to distribute the fluid flow across the entire area of the filter screen 160, such as by recessing the filter screen 160 below the surrounding surface (of the filtration layer 152) that is most adjacent the fluidic channel layer 154 (this method not shown), by providing a chamfer or countersink (not shown) the size of the associated filter screen 160 about the adjacent opening into the fluidic channel 162, by providing an intervening layer (not shown) with a bore therethrough of an area at least as large as, and aligned with, the filter screen 150, etc.

The fluidic channels 162 may be of various shapes to serve various purposes. For example, the fluidic channel 162 indicated at 162*a* is illustrated as a cylindrical bore through the fluidic channel layer 154. It functions to direct flow of fluid between a respective filter 160 in the filtration layer 152 and an associated portion of the fluid conduits 120*b* extending through the electronic interface layer 156, to be described below. The flow of fluid through the fluidic channel 162 indicated at 162*a* would be perpendicular to the planar fluidic channel layer 154.

As another example, the fluidic channel 162 indicated at 162*b* is illustrated as an extended slot formed through the fluidic channel layer 154. Similar to the fluidic channel 162 indicated at 162*a*, the fluidic channel 162 indicated at 162*b* also functions to direct flow of fluid between a respective filter 160 in the filtration layer 152 and an associated portion of the fluid conduits 120*b* extending through the electronic interface layer 164, to be described below. However, unlike the fluidic channel 162 indicated at 162*a*, the flow of fluid through the fluidic channel 162 indicated at 162*b* travels not only between the fluidic channel layer 154 and the electronic interface layer 156, but also flows within the plane of the fluidic channel layer 154.

Similarly, the fluidic channel 162 indicated at 162*c* also allows fluid flowing through the fluidic channel layer 154 to travel within the plane of the fluidic channel layer 154 to connect with an associated portion of one of the fluid conduits 120*b* extending through the electronic interface layer 156. The fluidic channels 162 thus form respective portions of the fluid conduits 120*b* within the fluidic channel layer 154 that permit the aspect change from the widely spaced apart openings into the fluid conduits 120*b* arranged in a straight line (as shown in shown in FIGS. 5A and 5B), to the closely grouped openings into the fluid conduits 120b arranged in a triangular arrangement (as shown in FIG. 1).

The fluidic channels 162 may provide for more than a passageway from a filter in the filtration layer 152 to a single associated portion of a fluid conduit 120b extending through the electronic interface layer 154. For example, the fluidic channel 162 indicated at 162c has a branch, indicated at 162d, that additionally provides fluid communication with a sensor interface port 164 extending through the electronic interface layer 156.

The electronic interface layer 154 may be formed of any suitable material, such as a metal such as aluminum; a ceramic; a polymer, glass, a semiconductor material, or a composite material such as a fiberglass reinforced plastic composite material; etc., or combinations thereof. One material believed to be especially suitable to form at least a part of the electronic interface layer 154 is FR-4-PCB. If the electronic interface layer 154 is made of a conductive material such as a metal, the conductive portion may be selectively coated with an insulating material (not shown) in appropriate locations by known methods while leaving other locations uncoated. Such an arrangement would allow (for example) interconnection of the connecting wires 108 with the set of external connecting wires 112 (not shown in FIG. 6). The interconnection between the first set of connecting wires 108 and the set of external connecting wires 112 may be made in any suitable fashion, such as interconnections made via a suitable conductive material (such as copper, copper alloy, nickel, gold, etc.) fixed (by electroplating, sputtering, screen printing, laminating, or other suitable technique) to the top surface of the electronic interface layer 154 of the die carrier substrate 102. In a preferred embodiment, the interconnection is made using conductive pathways, tracks or signal traces etched from copper sheets laminated onto a non-conductive material made of FR-4-PCB to form wire bond or solder pads 114.

For example, as best seen in FIG. 6, each pad 114 has a first portion 114a connected to an associated second portion 114b by a conductive pathway. The illustrated first portions 114a form wire bond or solder bond pads for connecting respective wires of the first set of wires 108. It will be appreciated that each first portions 114a thus form an electrical connection point on the die carrier substrate 102, while the associated wire of the first set of wires 108 forms an electrically conductive path between a micromachined component (in the form of the MEMS device 104), and the first portion 114a of the pad 114 forming the electrical connection point. The illustrated second portions 114b form external electrical interface pads that may be connected to a respective one of the external connecting wires 112, by means of direct soldering, wire clamps, terminals, pins and sockets, etc. A further conductive area which may be etched from such laminated copper sheets (or otherwise formed from conductive material and attached to the substrate of the electronic interface layer 156) may be an electronic component area 170 where miscellaneous electronic components (such as capacitors, electronic chips, diodes, etc. for various purposes may be mounted. Although not shown in FIG. 6, the electronic component area 170 may various conductive pathways etched into the copper sheet in the electronic component area 170.

Furthermore, as indicated above, the electronic interface layer 154 may be formed of multiple sub-layers, whereby, for example, multi-embedded circuits can be interconnected in a compact fashion. It is further contemplated that the additional multiple sub-layers may not be of the same size. For example, the electronic component area 170 may be formed over two or more sub-layers of the electronic interface layer 154, only one of which (which may be the bottom sub layer, i.e., the sub layer closest to the fluidic channel layer 154) also extends under the MEMS device 104.

Another area that may be etched from such laminated copper sheets attached to the substrate of the electronic interface layer 156 may be a MEMS chip attachment interface pad 172, which may act as at least a portion of the prepared surface 120a of the MEMS chip attachment interface 120. The MEMS chip attachment interface pad 172 may be formed of any material to which the MEMS device 104 can be affixed as described above. As further described above, some methods of fixing the MEMS device 104 to the die carrier substrate 102, and specifically to the electronic interface layer 156, might not require the use of a copper pad for forming a soldered connection between the MEMS device 104 and the die carrier substrate 102. Thus, the MEMS chip attachment interface pad 172 may be omitted in some instances.

Within the area of the prepared surface 120a to which the MEMS device 104 is to attached, which may include the MEMS chip attachment interface pad 172, fluid ports 174 may be formed. The fluid ports 174 are openings into the portions of respective ones of the fluid conduits 120b that extend through the electronic interface layer 156. The fluid ports 174 may be suitably through-lined to provide a leak-tight fluid flow path between the MEMS device 104 and the portions of the fluid conduits 120b formed by the fluidic channels 162 within the fluidic channel layer 154. The fluid ports 174 may be through-lined with a suitable metallic material (such as solder, copper, nickel, gold, etc.), which may be especially desirable if the electronic interface layer 156 is formed of a porous material or a composite material such as FR-4-PCB, for example. However, if the electronic interface layer 156 is formed of a non-porous material such as a polymer or a solid metal, such through-lining would not be required to form a fluid-tight passageway through the electronic interface layer 156. The fluid ports 174 may be formed by any suitable means (which may vary depending upon the material from which the electronic interface layer 156 is formed), such as punching, drilling, etching, laser cutting, molding during formation of the rest of the electronic interface layer 156, etc.

The sensor interface port 164 may be similarly suitably through-lined if desirable. The sensor interface port 164 provides fluid communication between the portion of the fluid channel 162 indicated at 162d within the fluidic channel layer 15 and the sensor 140 mounted on the top surface of the die carrier substrate 102. A sensor chip attachment interface pad 176 may be formed of any material to which the sensor 140 can be fixed by any suitable means. For example the sensor chip attachment interface pad 176 may be formed of copper material such as a copper sheet fixed to the substrate material of the electronic interface layer 156, and the sensor 140 may be soldered to the sensor chip attachment interface pad 176, with a void in the solder permitting communication between the sensor interface port 164 and the sensor 140. Similar to the MEMS device 104, some methods of fixing the sensor 140 to the die carrier substrate 102, and specifically to the electronic interface layer 156, might not require the use of a copper pad for forming a soldered connection between the MEMS device 104 and the die carrier substrate 102. Thus, the MEMS chip attachment interface pad 172 may be omitted in some instances. Thus, the sensor 140 may be in fluid communication with, and monitoring conditions in, an associated one of the fluid channels 162, which in turn may also be in fluid communication with the MEMS device 104.

Figure 7:
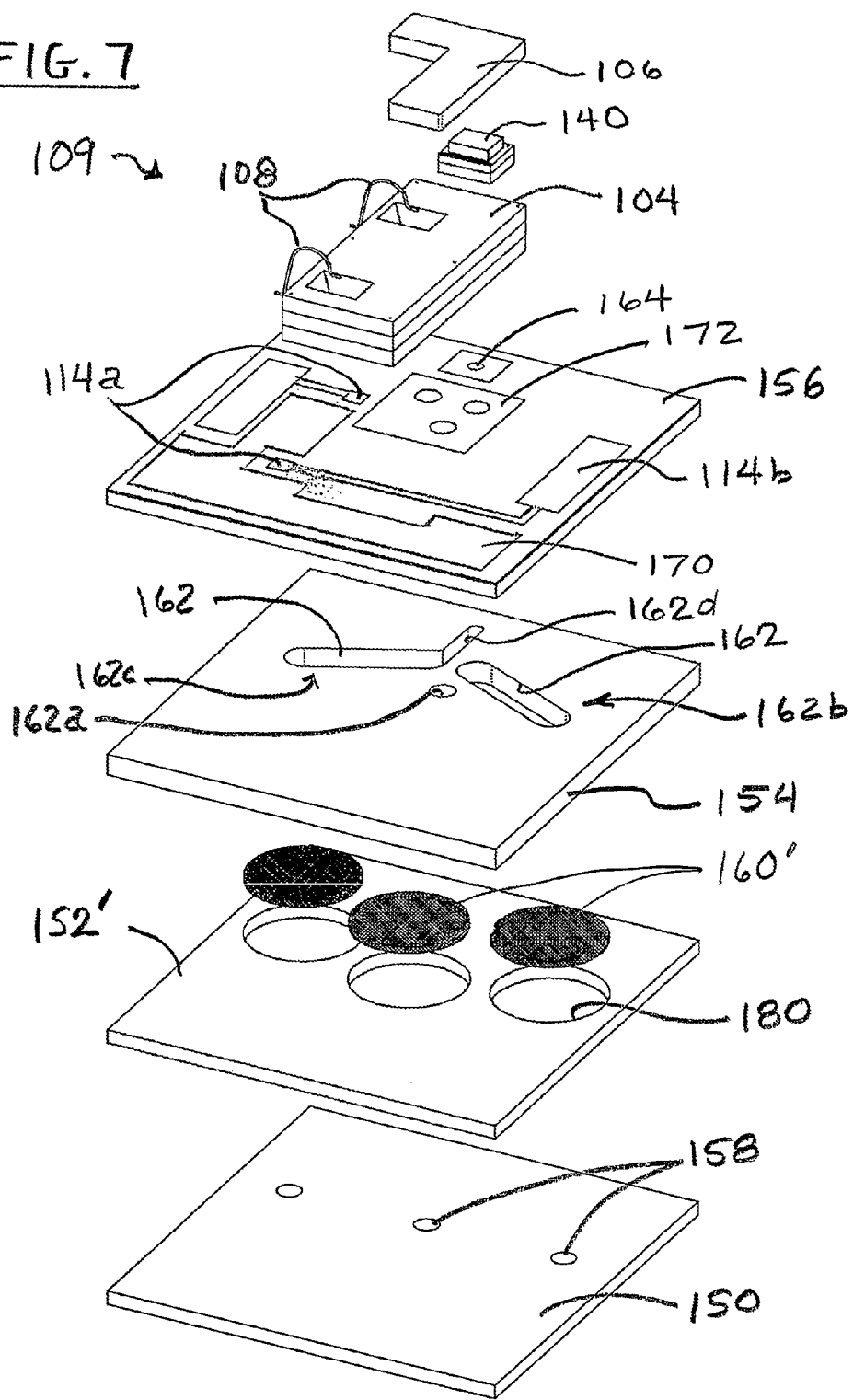
FIG. 7 is a view similar to FIG. 6, except showing an alternate embodiment of a MEMS package having filters separately formed for installation in a filtration layer.

FIG. 7 shows an alternate embodiment of the MEMS package platform 109, which may be otherwise identical to that of the embodiment illustrated in FIG. 6, except having filter screens 160' that are separately formed for installation in a filtration layer 152'. The filtration layer 152' is identical to the filtration layer 152, except that the filtration layer 152' may define a plurality of filter receiving apertures 180.

The filter screens 160' may be formed of any suitable material, such as a ceramic, polymer, glass, semiconductor or crystalline material, a composite material, or a metal, such a woven metal mesh. The filter screens 160' may be formed in any fashion suitable for the material of which the filter screens 160' are composed, such as by punched, drilling, laser cutting, molding, sintering of metallic, glass, ceramic, or polymeric particles, etc. Preferably, however, the filter screens 160' are sintered metal screens. After the filter screens 160' are manufactured, individual filter screens 160' are placed in respective ones of the filter receiving apertures 180 during assembly of the MEMS package platform 109. Provisions may be made for minimizing leakage of fluid flowing through the filtration layer 152' around the circumference of each filter screen 160, such as by provision of an o-ring (not shown). However, in a preferred embodiment, the filter screens 160' are of greater diameter than the adjacent fluid ports 158 through the adjacent fluid introduction layer 150, and each filter screen 160' is held abutting the fluid introduction layer 150, so that substantially all flow through the filter screen 160' is through a central portion of the filter screen 160'.

It will be appreciated that each filter screens 160' is a filter element, formed separately from a body of supporting material in the form of the remainder of the filtration layer 152'. This body of supporting material and the filter elements cooperate define the filtration layer 152' in the multi-layer die carrier substrate illustrated in FIG. 7. It will be further appreciated the filter elements in the form of the filter screens 160' disposed in the filter receiving apertures 180 are supported by the body of supporting material through which the filter receiving apertures 180 are defined, to filter a fluid flow through the filtration layer 152.

Figure 8:
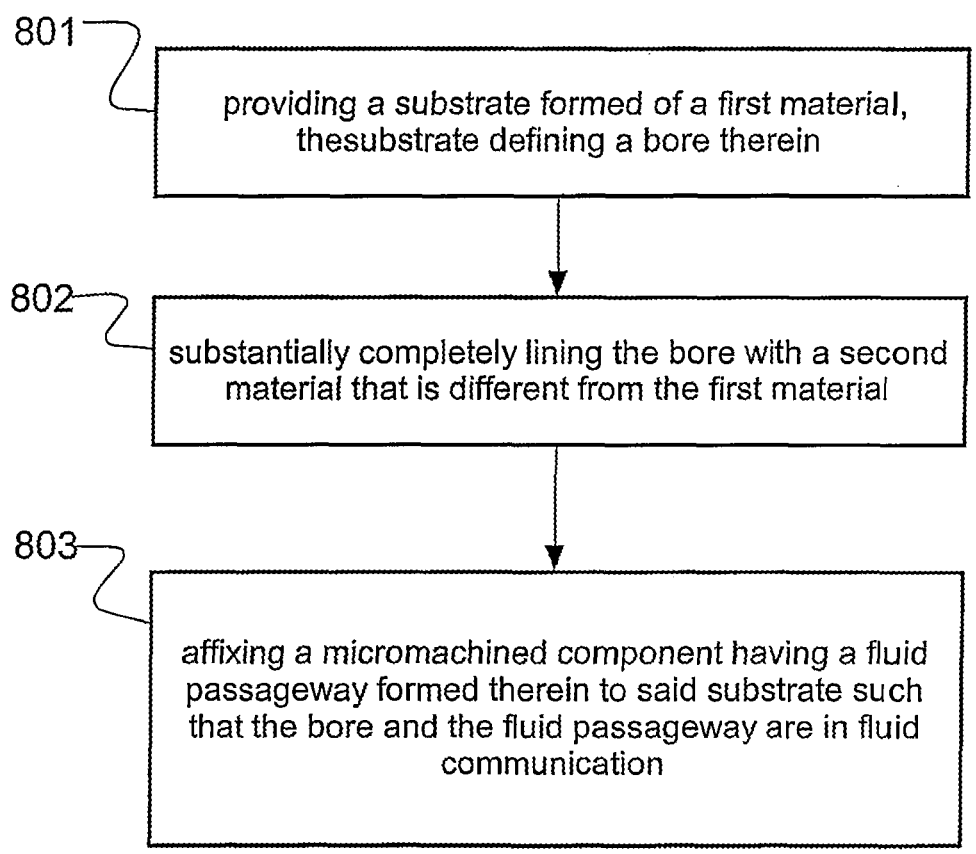
FIG. 8 is a flow chart illustrating a method of manufacturing a MEMS package.

FIG. 8 is a flow chart illustrating a method of manufacturing a MEMS package platform. A first step, indicated at 801, includes providing a substrate formed of a first material, the substrate defining a bore therein. A second step, indicated at 802, includes substantially completely lining the bore with a second material that is different from said first material. A third step, indicated at 803, includes affixing a micromachined component having a fluid passageway formed therein to the substrate such that the bore and the fluid passageway are in fluid communication. Additionally, the method may further include a step (not illustrated) of forming an electrical connection point on the substrate; and a further step (not illustrated) of electrically connecting the electrical connection point and the micromachined component.

FIG. 9 is a flow chart illustrating a method of manufacturing a MEMS package platform. A first step, indicated at 901, includes providing a multi-layer substrate formed of: an electronic interface layer, the electronic interface layer comprising an electrical conductor and a bore defined through the electronic interface layer; a fluidic channel layer, the fluidic channel layer defining a space therein; and a fluid introduction layer, the fluid introduction layer defining a fluid port, the space defined in the fluidic channel layer being in fluid communication with the fluid port of the fluid introduction layer. A second step, indicated at 902, includes affixing an electrically active micromachined component having a fluid passageway formed therein to the multi-layer substrate, such that: the electrical conductor of the electronic interface layer is electrically connected to the electrically active micromachined component; and the bore of the electronic interface layer is in fluid communication with the fluid passageway of the electrically active micromachined component and in fluid communication with the space defined in the fluidic channel layer.

Figure 10:
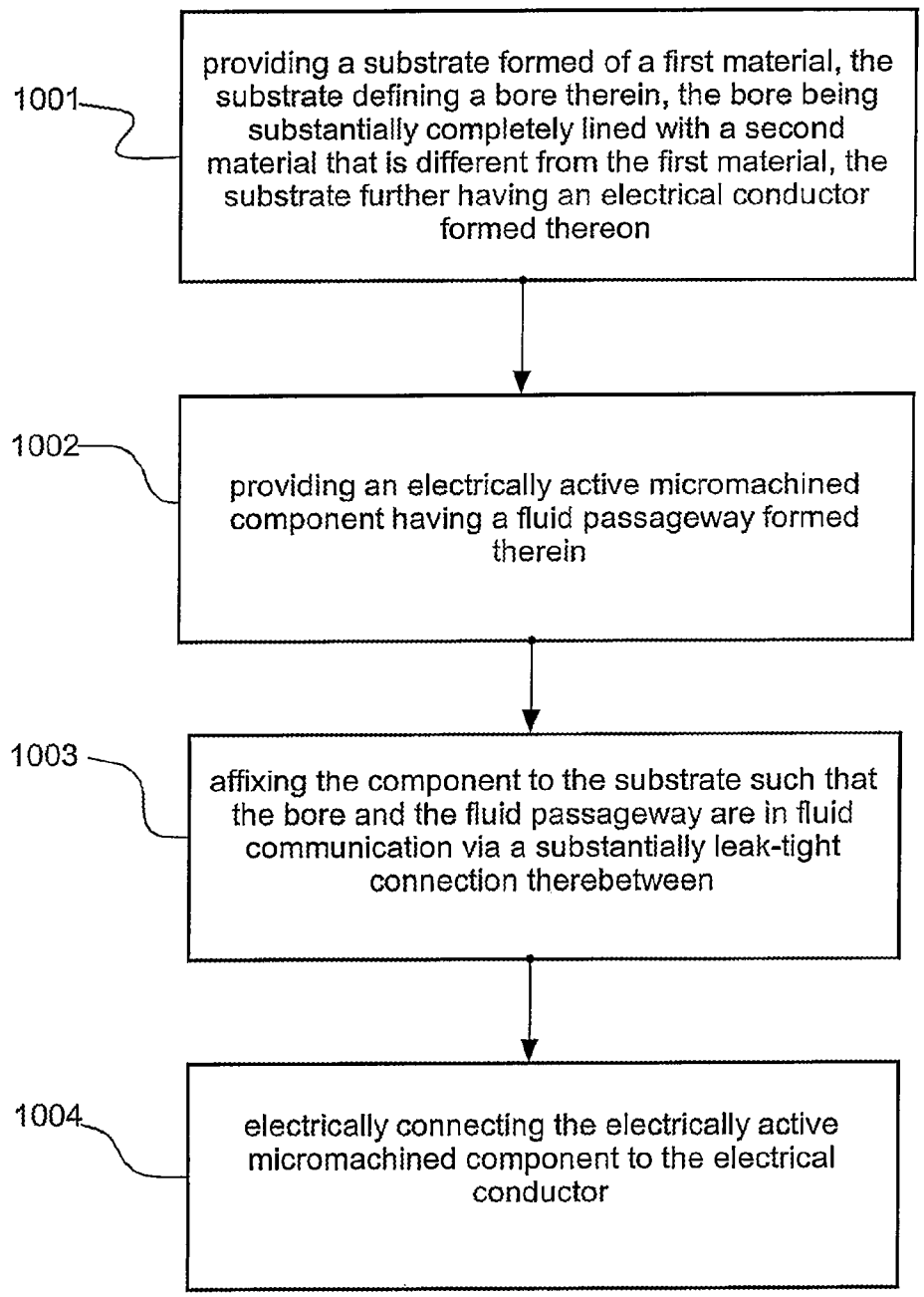
FIG. 10 is a flow chart illustrating an alternative method of manufacturing a MEMS package.

FIG. 10 is a flow chart illustrating a method of manufacturing a MEMS package platform. A first step, indicated at 1001, includes providing a substrate formed of a first material, the substrate defining a bore therein, the bore being substantially completely lined with a second material that is different from the first material, the substrate further having an electrical conductor formed thereon. A second step, indicated at 1002, includes providing an electrically active micromachined component having a fluid passageway formed therein. A third step, indicated at 1003, includes affixing the component to the substrate such that the bore and the fluid passageway are in fluid communication via a substantially leak-tight connection therebetween. A fourth step, indicated at 1004, includes electrically connecting the electrically active micromachined component to the electrical conductor. Suitably, the third step 1003 and the fourth step 1004 may be performed substantially simultaneously.

Figure 11:
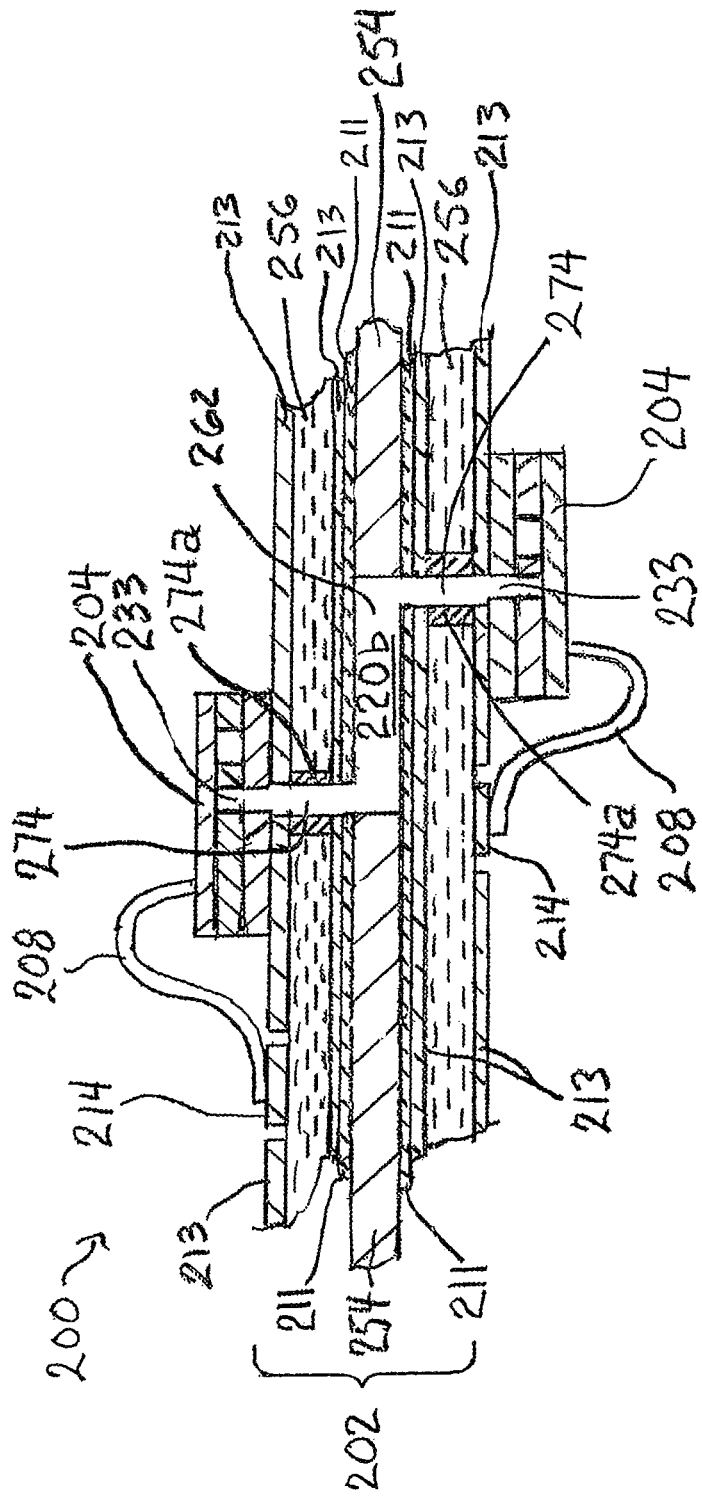
FIG. 11 is a partial cross-sectional view of a MEMS package including two MEMS devices, showing fluidic interconnection of the two MEMS devices.

FIG. 11 is a partial cross-sectional view of a MEMS package, indicated generally at 200, including two MEMS devices 204, showing an arrangement for fluidic interconnection of the two MEMS devices 204. The MEMS devices 204 may be any suitable type of micromachined device, and need not be the same type of micromachined device. For example, a first MEMS device 204 might be a micromachined pump, and a second MEMS device 204 to which the first MEMS device is fluidly interconnected may be a micromachined pressure sensor or a microvalve. As illustrated, the two MEMS devices 204 are shown as two microvalves, each having a fluid passageway 233. As further illustrated, the MEMS devices 204 are mounted on opposite faces of a die carrier substrate, indicated generally at 202. Like the die carrier substrate 102, the die carrier substrate 202 may be formed of any suitable material, such as a metal such as aluminum; a ceramic; a polymer, glass, a semiconductor material, or a composite material such as a fiberglass reinforced plastic composite material; etc. One material believed to be especially suitable to form at least a part of the die carrier substrate 202 is FR-4-PCB. As illustrated, the die carrier substrate 202 includes multiple sub-layers, including two electronic interface layers 256, and a fluidic channel layer 254 fixed between the two electronic interface layers 256.

Each electronic interface layer 256 may be similar in construction and function to the electronic interface layer 156 described above. Suitably, the electronic interface layers 256 may be formed of FR-4-PCB, and each includes one or more fluid ports 274 extending through the respective electronic interface layers 256. The fluid ports 274 may be formed by suitable means (such as punching, drilling by mechanical bit or laser, etching, etc.). The fluid ports 274 are illustrated as being through-lined with a suitable second material 274a (different from the first material from which the electronic interface layer 256 is formed, and preferably a metal metallic material such as solder, copper, nickel, gold, etc.), which may be especially desirable if the electronic interface layer 256 is formed of a porous material or a composite material such as FR-4-PCB, for example. In a preferred embodiment, copper sheets 213 are laminated onto both faces of the FR-4-PCB of the electronic interface layers 256. The sheets 213 may be etched to form solder pads 214, by means of which the MEMS devices 204 may be conveniently connected to an external electrical circuitry. For example, one end of a connecting wire 208 may fixed to a respective pad 214 by a suitable method, such as soldering or wire bonding, and fixed at the other end of the wire 208 to the associated MEMS device 204.

The fluidic channel layer 254 includes one or more fluid channels 262 formed therethrough. The fluidic channel layer 254 may be similar in construction and function to the fluidic channel layer 154 described above. The fluidic distribution layer 254 is preferably formed of a material or combination of materials that may be attached by a layer of solder (or braze material, etc.) 211 to the adjacent sheets 213 of the adjacent electronic interface layers. The solder layer 211 seals around the fluid channel 262 to form a leak-tight connection.

Voids in the solder layer 211 allow fluid communication between the fluid channel 262 and an associated fluid port 274 in each of the electronic interface layers 256. The fluid ports 274 and the fluid channel 262 illustrated in FIG. 11 form a fluid conduit 220$b$ providing fluid communication between the MEMS devices 204 so that a fluid passageway 233 in a first one of the MEMS devices 204 is in fluid communication with a fluid passageway in a second one of the MEMS devices 204.

Figure 12:
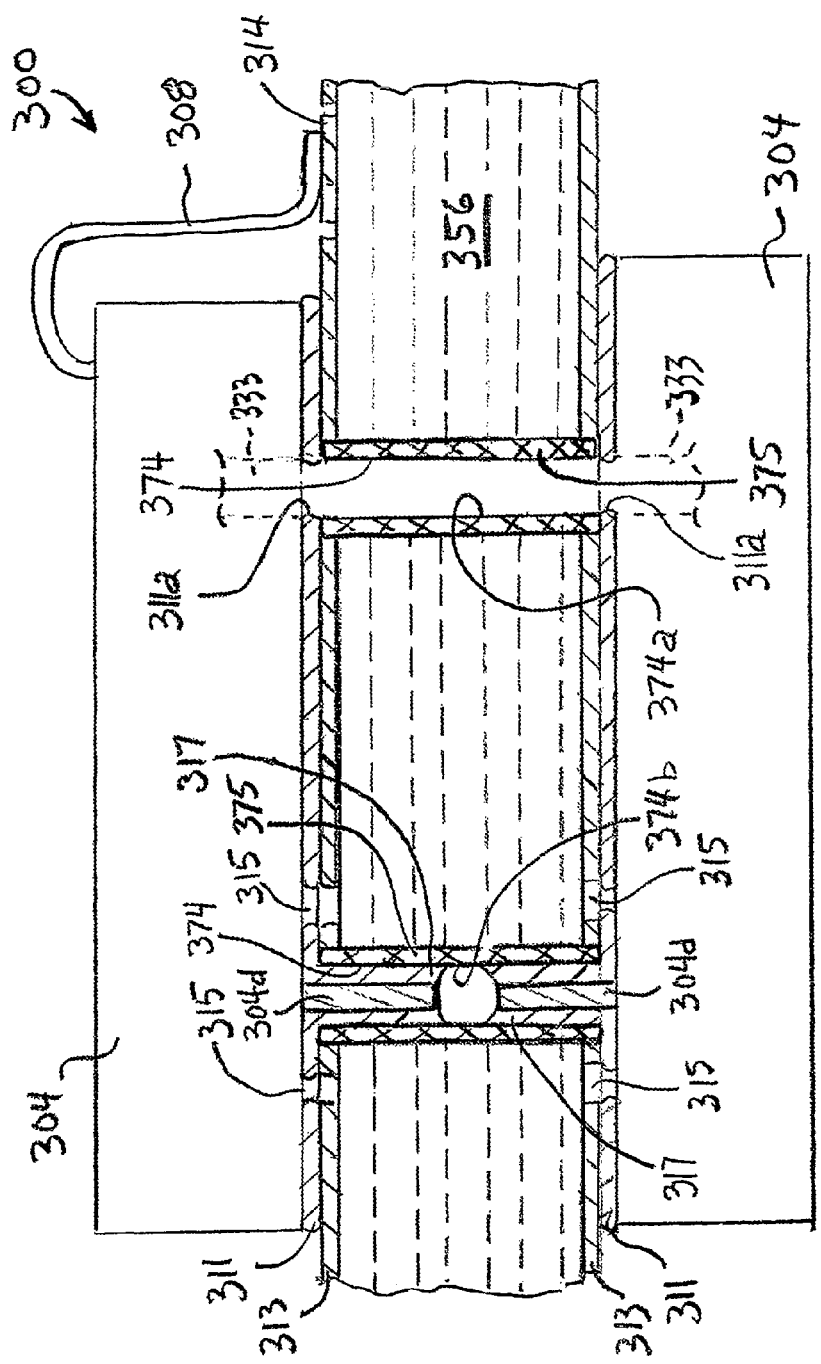
FIG. 12 is a view similar to FIG. 10, showing an alternate arrangement with electrical and fluidic interconnection of the two MEMS devices.

FIG. 12 is a view similar to that of FIG. 11, showing an alternate arrangement of a MEMS package, indicated 300, with both electrical and fluidic interconnection of two MEMS devices 304. The MEMS devices 304 may be any suitable type of micromachined device, and need not be the same type of micromachined device. For example, a first MEMS device 304 might be a micromachined pump, and a second MEMS device 304 to which the first MEMS device is fluidly interconnected may be a micromachined pressure sensor or a microvalve. As illustrated, the two MEMS devices 304 each have a fluid passageway 333. Each of the MEMS devices 304 is illustrated as having an electrical connection pin 304$d$ extending therefrom, the purpose of which will be discussed below.

As further illustrated, the MEMS devices 304 are mounted on opposite faces of a die carrier substrate, indicated generally at 302. Like the die carrier substrate 102, the die carrier substrate 302 may be formed of any suitable material, such as a metal such as aluminum; a ceramic; a polymer, glass, a semiconductor material, or a composite material such as a fiberglass reinforced plastic composite material; etc. One material believed to be especially suitable to form at least a part of the die carrier substrate 302 is FR-4-PCB. As illustrated, the die carrier substrate 302 may include an electronic interface layer 356.

The electronic interface layer 356 may be similar in construction and function to the electronic interface layer 156 described above. Suitably, the electronic interface layer 356 may be formed of a first material, such as FR-4-PCB, and may include two lined-holes 374 extending through the electronic interface layer 356, including a first lined hole 374$a$ forming a fluid port that provides fluid communication between the MEMS devices 304, as will be discussed below, and a second lined-hole 374$b$ providing an electrical connection between the MEMS devices 304, as will be discussed below. The lined-holes 374 may be formed by suitable means (such as punching, drilling by mechanical bit or laser, etching, etc.). The lined-holes 374 are illustrated as being substantially completely lined with a suitable second material 375 (different from the first material from which the electronic interface layer 356 is formed, and preferably a metal, such as solder, copper, nickel, gold, etc.), which may be especially desirable if the first material from which the electronic interface layer 356 is formed of a porous material or a composite material such as FR-4-PCB, for example. The first lined hole 374$a$ may be lined with a different material than the second lined hole 374$b$, allowing the first lined hole 374$a$ to utilize material that is optimized for the task of conveying a particular fluid therethrough, while the second lined hole 374$b$ can utilize a material optimized for the task of electrical interconnection.

It should be understood that any suitable means for substantially completely lining the lined holes 374 with a second material different from a first material through which the lined hole 374 extends. Although through-plating is one preferred method, other suitable methods may be utilized, including the provision of a hollow rivet to form a lining; sputtering, vapor deposition, etc.

In a preferred embodiment, copper sheets 313 are laminated onto both faces of the FR-4-PCB of the electronic interface layers 356. The sheets 313 may be etched to form solder pads 314 (only one shown), by means of which the MEMS devices 304 may be conveniently connected to an external electrical circuitry (not shown). For example, one end of a connecting wire 308 may fixed to a respective pad 314 by a suitable method, such as soldering or wire bonding, and fixed at the other end of the wire 308 to the associated MEMS device 304. An annular gap 315 may be etched in the relevant copper sheets 313 about the openings at each end of the second lined hole 374$b$ to electrically isolate the second lined hole 374$b$ from the rest of the associated copper sheet 313.

The MEMS devices 304 are preferably formed of a material or combination of materials that may be attached by a layer of solder (or braze material, etc.) 311 to the adjacent sheets 313 of the adjacent electronic interface layers. The solder layer 311 seals around the fluid passageways 333 of each of the MEMS devices 304 to form a leak-tight connection between the MEMS devices 304 and the adjacent copper sheets 313 of the die carrier substrate 304, mechanically affixing the MEMS devices 304 to the die carrier substrate 302.

A void 311$a$ in the solder layer 311 allow fluid communication between the fluid passageway 333 of the associated MEMS device 204 and the lined hole channel 362 and an associated fluid port 374 in each of the electronic interface layers 356. The first lined-hole 374$a$ and the voids 311$a$ in the solder layer 311 cooperate to define a fluid conduit 320$b$ providing fluid communication between the MEMS devices 304 so that a fluid passageway 333 in a first one of the MEMS devices 304 is in fluid communication with a fluid passageway in a second one of the MEMS devices 304.

An annular void in the solder layer 311 is formed at the annular gap 315 in each copper sheet 313, so that the solder layer 311 does not connect the second lined hole 374$b$ to the portion of the copper sheet 313 from which the second lined hole 374$b$ is otherwise electrically isolated by the annular gap 315. The electrical connection pin 304$b$ of each MEMS device 304 may extend into opposite ends of the second lined hole 374. Solder 317 is provided to create an electrical connection between each electrical connection pin 304$b$ and the material lining the second lined hole 374$b$. Thus, a path for electrical current is defined from a first one of the MEMS devices 304, through the associated electrical connection pin 304$d$, the solder 317, the electrically conductive second material lining the second lined hole 374$b$, more solder 317, to the second MEMS device 304 via the second MEMS device's electrical connection pin 304$d$.

It will be appreciated that the arrangement illustrated in FIG. 12 permits a relatively compact arrangement of two interconnected MEMS devices 304 (compared to a side-by side arrangement of interconnected MEMS devices on a common die carrier substrate 302. As illustrated, a connection between a first MEMS device 304 and an external electrical circuit may be made via one or more wires 308 on one side of the die carrier substrate 302, and an electrical connection can be made to the second MEMS device 204 via the connection pins 304d and the second lined hole 374b; this electrical connection could pass through a connection to the external electrical circuit, so that no wires 308 connecting to the external electrical circuit need to be routed on the second side of the carrier substrate. Such an arrangement could simplify electrical connections. It will be also appreciated that the arrangement illustrated in FIG. 12 provides for both electrical and fluid interconnection of the illustrated two MEMS devices using lined holes 374.

It will be appreciated that both FIG. 11 and FIG. 12 illustrate a MEMS package a die carrier substrate having a first face and a second face opposite the first face, the die carrier substrate defining a hole extending between the first face and the second face. In both FIGS. 11 and 12, the illustrated MEMS packages further include a first MEMS device mounted on the first face of the die carrier substrate, and a second MEMS device mounted on the second face of the die carrier substrate, the first MEMS device and the second MEMS device being interconnected via the hole. Both FIGS. 11 and 12, illustrate MEMS packages having a hole providing fluid communication between the first MEMS device and the second MEMS device. In FIG. 12, the illustrated MEMS package shows a second hole that permits electrical interconnection between the first MEMS device and the second MEMS device. Both FIGS. 11 and 12 illustrate MEMS packages wherein a die carrier substrate is formed of a first material, and a hole through the die carrier substrate is substantially completely lined with a second material, different from the first material.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A method of manufacturing a MEMS package comprising:
   a) providing a multi-layer substrate formed of a first material, said substrate defining a bore through each layer, the bore having a fluid filter therein, the filter disposed within the multi-layer substrate;
   b) substantially completely lining said bore through its entire length with a second material that is different from said first material; and
   c) affixing a micromachined component having a fluid passageway formed therein to said substrate such that said bore and said fluid passageway are in fluid communication.

2. The method of manufacturing a MEMS package according to claim 1 further comprising:
   a step of forming an electrical connection point on said substrate; and
   a further step of electrically connecting said electrical connection point and said micromachined component.

3. A method of manufacturing a MEMS package comprising:
   a) providing a multi-layer substrate formed of:
   an electronic interface layer, said electronic interface layer comprising an electrical conductor and a bore defined through the electrical conductor and said electronic interface layer;
   a fluidic channel layer, said fluidic channel layer defining a space therein; and
   a fluid introduction layer, said fluid introduction layer having a fluid port formed therethrough; and
   b) affixing an electrically active micromachined component having a fluid passageway formed therein to said multi-layer substrate, such that:
   said electrical conductor of said electronic interface layer is electrically connected to said electrically active micromachined component; and
   said bore of said electronic interface layer is in fluid communication with said fluid passageway of said electrically active micromachined component and in fluid communication with said space defined in said fluidic channel layer; and said space defined in said fluidic channel layer is in fluid communication with said fluid port of said fluid introduction layer.

4. A method of manufacturing a MEMS package comprising:
   a) providing a substrate formed of a first material, said substrate defining a bore therein, said bore being substantially completely lined with a second material that is different from said first material, said substrate further having an electrical conductor formed thereon, said bore further having a fluid filter therein, the filter disposed within the substrate;
   b) providing an electrically active micromachined component having a fluid passageway formed therein;
   c) affixing said component to said substrate such that said bore and said fluid passageway are in fluid communication via a substantially leak-tight connection therebetween; and
   d) electrically connecting said electrically active micromachined component to said electrical conductor.

5. The method of manufacturing a MEMS package according to claim 4 wherein steps c) and d) are performed substantially simultaneously.

6. A method of manufacturing a MEMS package comprising:
   a) providing a multi-layer substrate formed of:
   an electronic interface layer, said electronic interface layer comprising an electrical conductor and a bore defined through said electronic interface layer;
   a fluidic channel layer, said fluidic channel layer defining a space therein;
   a fluid introduction layer, said fluid introduction layer defining a fluid port;
   a filtration layer between said fluid introduction layer and said fluidic channel layer; and
   b) affixing an electrically active micromachined component having a fluid passageway formed therein to said multi-layer substrate, such that:
   said electrical conductor of said electronic interface layer is electrically connected to said electrically active micromachined component; and
   said bore of said electronic interface layer is in fluid communication with said fluid passageway of said electrically active micromachined component and in fluid communication with said space defined in said fluidic channel layer; and said space defined in said fluidic channel layer is in fluid communication with said fluid port of said fluid introduction layer.

* * * * *